(12) United States Patent
Nilsson et al.

(10) Patent No.: US 6,771,121 B2
(45) Date of Patent: Aug. 3, 2004

(54) LINEARIZATION OF A PDM CLASS-D AMPLIFIER

(75) Inventors: Johan Nilsson, Lund (SE); Lars Lennartsson, Veberöd (SE); Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 72 days.

(21) Appl. No.: 10/336,967

(22) Filed: Jan. 6, 2003

(65) Prior Publication Data

US 2004/0090264 A1 May 13, 2004

(30) Foreign Application Priority Data

Dec. 11, 2002 (EP) ............................................ 02392023

(51) Int. Cl.⁷ ............................ H03F 3/38; H03F 3/217
(52) U.S. Cl. ...................... 330/10; 330/251; 330/207 A
(58) Field of Search ....................... 330/10, 251, 207 A

(56) References Cited

U.S. PATENT DOCUMENTS

| | | | |
|---|---|---|---|
| 5,506,532 A | * 4/1996 | Milazzo | 327/175 |
| 5,777,512 A | 7/1998 | Tripathi et al. | 330/207 A |
| 5,847,602 A | 12/1998 | Su | 330/10 |
| 5,878,146 A | * 3/1999 | Andersen | 381/312 |
| 6,191,650 B1 | 2/2001 | Backram et al. | 330/10 |
| 6,232,833 B1 | * 5/2001 | Pullen | 330/10 |
| 6,346,852 B1 | 2/2002 | Masini et al. | 330/10 |

FOREIGN PATENT DOCUMENTS

| | | | | |
|---|---|---|---|---|
| EP | 0503571 A1 | 9/1992 | ........... | H03F/3/217 |
| EP | 1049247 A1 | 2/2000 | ........... | H03F/3/217 |
| EP | 1184973 A1 | 6/2002 | ........... | H03F/3/217 |

OTHER PUBLICATIONS

US Publication Patent # US 2003/0087621 A1 of Roeckner et al., Variable Frequency Switching Amplifier and Method Therefor.*

Patent Application DS–02–004, "Class–D Amplifer with Digital Feedback", Ser. No. 10/277,502, filed Oct. 22, 2002, Assigned to the Same Assignee.

U.S. Patent App. Publication US2002/0135419 A1 to Groves, Jr. et al., Sep. 26, 2002, "Digital Amplifier with Improved Performance".

* cited by examiner

*Primary Examiner*—Patricia Nguyen
(74) *Attorney, Agent, or Firm*—George O. Saile; Stephen B. Ackerman

(57) ABSTRACT

A method to linearize the characteristic of a Class-D amplifier is achieved, by compensating for the pulse-area-error, caused by a non-constant power-supply and similar circuit inconsistencies. A Class-D Amplifier typically converts the PDM (Pulse Density Modulated) input signal with a Sigma Delta Modulator and typically uses an H-Bridge as the Class-D power output stage. A fundamental idea is to keep the time-voltage area of every pulse constant. To achieve this, the circuit integrates the power supply voltage, starting with the PDM input pulse and stopping, when the defined time-voltage reference is reached. To compensate not only for power supply variations, but also for e.g. the voltage drop across the output devices, the integrator's input would be more directly reference to the actual voltage across the output load.

37 Claims, 3 Drawing Sheets

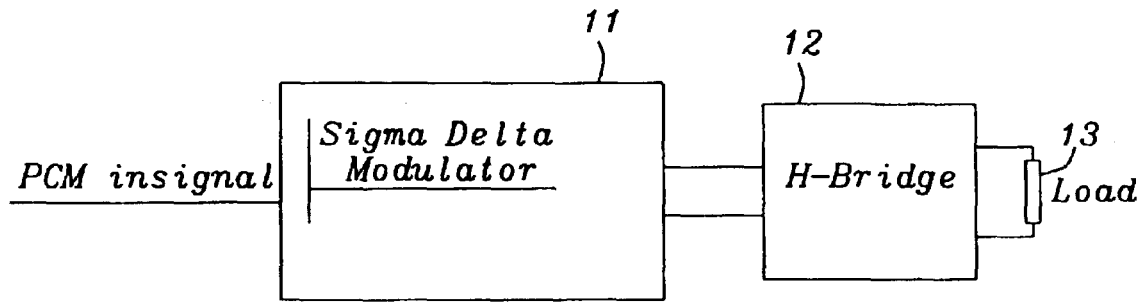
FIG. 1 – Prior Art
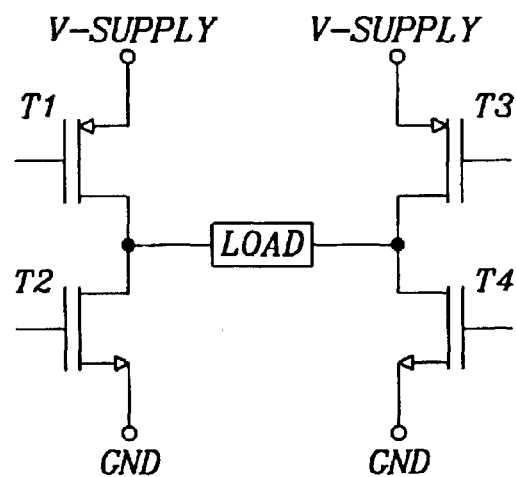
FIG. 2 – Prior Art

LINEARIZATION OF A PDM CLASS-D AMPLIFIER

RELATED PATENT APPLICATION

This application is related to U. .S patent application Ser. No. 10/277,502, filed on Oct. 22, 2002, and assigned to the same assignee as the present invention.

BACKGROUND OF THE INVENTION

(1) Field of the Invention

The invention relates to a Class-D Power Amplifier, and more particularly, to a Class-D Power Amplifier having a pulse coded digital input signal and typically using an H-Bridge to drive an output load, like a loudspeaker.

(2) Description of the Prior Art

Class-AB amplifiers are notoriously inefficient and Class-D amplifiers overcome this shortfall. With Class D amplifiers, the output is made to switch between the two output levels at a very high frequency—substantially higher than the highest audible frequency, which is done by feeding high-frequency pulses to the power amplification stage. The pulse-density ratio of the driving signal can be varied in order to make the averaged (filtered) output signal follow the (amplified) input signal very closely; such amplifier is referred to as pulse density modulated (PDM). Similarly, the amplifier input signal could also be pulse width modulated (PWM), were the width of pulses is varied to make the averaged (filtered) output signal follow the input signal. The output voltage at the load represents the input signal correct as long as the supply voltage is perfectly constant. However the amplitude of the switched voltage is in real life not fixed. Class D power stages per se have no power supply ripple rejection. In addition switch-induced ringing on the power supply and the voltage drop at the power driver devices similarly cause amplitude errors.

FIG. 1 prior art shows a schematic block diagram of a state-of-the-art PDM Class-D Amplifier. It typically comprises a Sigma Delta Modulator, or a similar converter, to generate the driving signal for the Class-D power output stage, which is typically an H-Bridge and a loudspeaker.

FIG. 2 prior art shows a simplified diagram of an H-Bridge. If Transistors T1 and T4 are closed and Transistors T2 and T3 are open, the voltage at the load LOAD is (approximately)+V-Supply. If Transistors T2 and T3 are closed and Transistors T1 and T4 are open, the voltage at the load LOAD is (approximately)−V-Supply. If Transistors T2 and T4 are closed and Transistors T1 and T3 are open, the voltage at the load LOAD is (approximately) zero. This shows, the voltage across said load LOAD can take one of three states: +V-Supply, −V-Supply or zero.

U.S. Pat. No. (6,346,852 to Masini et al) describe a class D amplifier including an input integrating stage and a modulating stage for modulating the integrated input signal output by the integrating stage. The modulating stage uses as a carrier an alternate waveform of a frequency sufficiently higher than the frequency band of the analog input signal. The modulating stage further outputs a digital signal switching between a positive voltage and a negative voltage, and whose average value represents an amplified replica of the input analog signal. The class D amplifier further includes an output power stage producing an output digital signal. A feedback line including a resistor is connected between the output of the output power stage and an input node of an operational amplifier. The class D amplifier also includes a low-pass filter reconstructing an output analog signal, and a delay stage. The delay stage is functionally coupled in the direct path of propagation of the digital signal from the output of the modulating stage to an input of the output power stage. The delay stage delays the digital signal from the output of the modulating stage by a delay. The value of the delay is defined as a function of a desired broadening of the bandwidth and in consideration of the corresponding restriction of the range of variation of the duty cycle of the output digital signal.

U.S. Pat. No. (5,847,602 to Su, David) shows a delta-modulated magnitude amplifier which is used to amplify the magnitude component of an RF power amplifier that employs envelope elimination and restoration. The delta-modulated amplifier introduces a smaller amount of non-linearity than traditional approaches, which are based upon pulse-width modulation. The disclosed technique can be implemented using switched-capacitor circuits in a standard MOS technology with only two external components, i.e., an inductor and a capacitor. Thus, the disclosed technique allows the implementation of an efficient and yet linear RF power amplifier using low-cost MOS technology.

U.S. Pat. No. (6,191,650 to Backram, et al) describes a class D amplifier in which a high-frequency reference signal is pulse width modulated by an input signal and in which there are generated a pair of bipolar pulse drive signals, comprising an error generator which forms a signal with an average value which corresponds to the DC component of the pulse drive signals, and which is fed back to the pulse width modulator for the adjustment of the modulator.

SUMMARY OF THE INVENTION

A principal object of the invention is to linearize the characteristic of a Class-D power output stage. Such amplifiers typically use an H-Bridge to drive an output load, like a loudspeaker. If the supply voltage for the amplifier and other operating conditions are not constant, this will result in output signal distortion. A basic requirement is therefore to compensate for the pulse area error, caused by the variations in the supply voltage and other deviations.

A fundamental idea is to keep the time-voltage area of every pulse constant. To achieve this, the circuit first determines the ideal pulse area and then determines the optimized pulse width, based on said deviation of the supply voltage and of certain other operating conditions.

A "Length of Pulse Integrator" Function takes the actual supply voltage and starts integrating it, beginning at each start point of the input signal pulse. When the integrated value reaches a specific reference level, which represents the desired time-voltage area, the integration stops the output signal pulse.

To compensate not only for power supply variations, but also for e.g. the varying voltage drop across the output devices, the input voltage to the integrator should be taken from the actual voltage across the output load.

In accordance with the objectives of this invention, a circuit for linearization of output pulses in a Class-D Amplifier comprises a unit to convert the input into PDM (Pulse Density Modulated) control pulses, typically a Sigma Delta Modulator. The circuit also comprises a "Pulse Generator Unit" inserted into the signal path between said converter of PDM signals and the Class-D output power stage, which is, as said before, typically an H-Bridge. Said H-Bridge drives voltage into said output load, like a loudspeaker.

The key element of this invention is the "Length of Pulse Integrator", which comprises an integrator for a signal, representing the actual voltage across the output load and a unit to determine the proper reference level. Further it comprises a logic function to produce the optimum pulse width, providing the correct stop signal for the output pulse, which it feeds into said "Pulse Generator Unit".

In accordance with the objectives of this invention, a method for linearization of output pulses in a Class-D Amplifier is implemented. First it integrates a signal, representing the actual voltage across the output load. Then it determines the proper reference level. Further, it determines the correct stop signal for the output pulse and feeds the resulting control signal into said "Pulse Generator Unit".

Further, in accordance with the objectives of this invention, said pulse area reference level may not only be of fixed level, but may also be externally controlled.

BRIEF DESCRIPTION OF THE DRAWINGS

In the accompanying drawings, forming a material part of this description, there is shown:

FIG. 1 (Prior Art) shows the schematic block diagram for a prior art solution.

FIG. 2 (Prior Art) shows a principal circuit of an H-Bridge.

DESCRIPTION OF THE PREFERRED EMBODIMENTS

According to the objectives of the invention, to linearize the output pulses in a Class-D Amplifier, especially to compensate for the pulse area error, caused by the variations in the supply voltage and similar dependencies, a pulse area compensation function is inserted into the signal path between the PDM (Pulse Density Modulated) converter and the output power driver.

A fundamental idea is to keep the real time-voltage area of every pulse constant. To achieve this, the circuit first determines the ideal pulse area and then determines the preferable pulse width, based on said deviation of the supply voltage and of certain other operating conditions.

Figures 3, 4A, 4B:
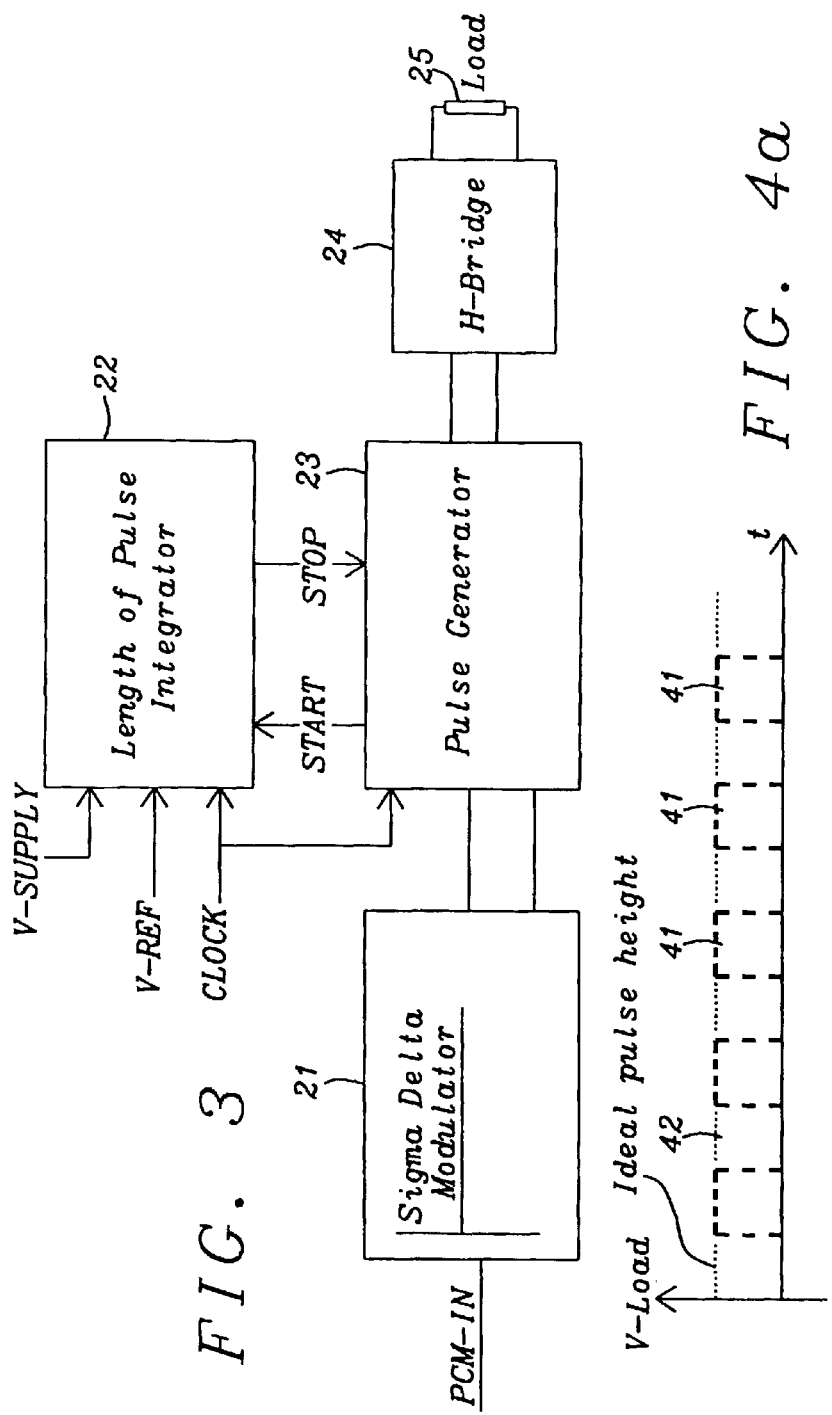
FIG. 3 shows a schematic block diagram of a solution, in accordance with an embodiment of this invention.
FIGS. 4a and 4b show the relationship of ideal pulses and real pulses.

FIG. 3 shows a schematic block diagram as disclosed in this invention.

A PDM Class-D Amplifier typically comprises a Sigma Delta Modulator (21) to generate the driving signal for the Class-D power output stage, which is typically an H-Bridge (24). Said Sigma Delta Modulator converts the input signal into ideal (uncompensated) PDM (Pulse Density Modulated) control pulses.

A "Length of Pulse Integrator" (22) starts integrating the supply voltage beginning at each start point of its input signal pulse. When the integrated value reaches a specific reference level, which represents the desired time-voltage area, the integration stops the output signal pulse.

The "Pulse Generator Unit" (23) then produces the power driver pulses, based on the control signals START and STOP, which it exchanges with said "Length of Pulse Integrator" unit.

Said H-Bridge finally drives the output load (25), typically a loudspeaker.

To compensate not only for power supply variations, but also for the varying voltage drop across the power driver's output devices, the input voltage to the integrator should be referenced to the actual voltage across the output load. However, simply using the varying power-supply voltage as the signal to integrate is a very good compromise.

FIG. 4a shows ideal pulses 41 under the condition of constant supply voltage. Said ideal pulses are drawn with dotted lines. The gray line represents the ideally constant load voltage 42.

FIG. 4b shows the relation of the original real pulses and the corrected pulses under the condition of supply voltage variation. The ideal pulses of FIG. 4a are shown again as reference with dotted lines 43. The gray line now represents the varying load voltage 44 under actual conditions. If the voltage over the load is high, the pulses 45 must be shorter, however if the voltage over the load is low, the pulses 46 must be longer.

Figure 5:
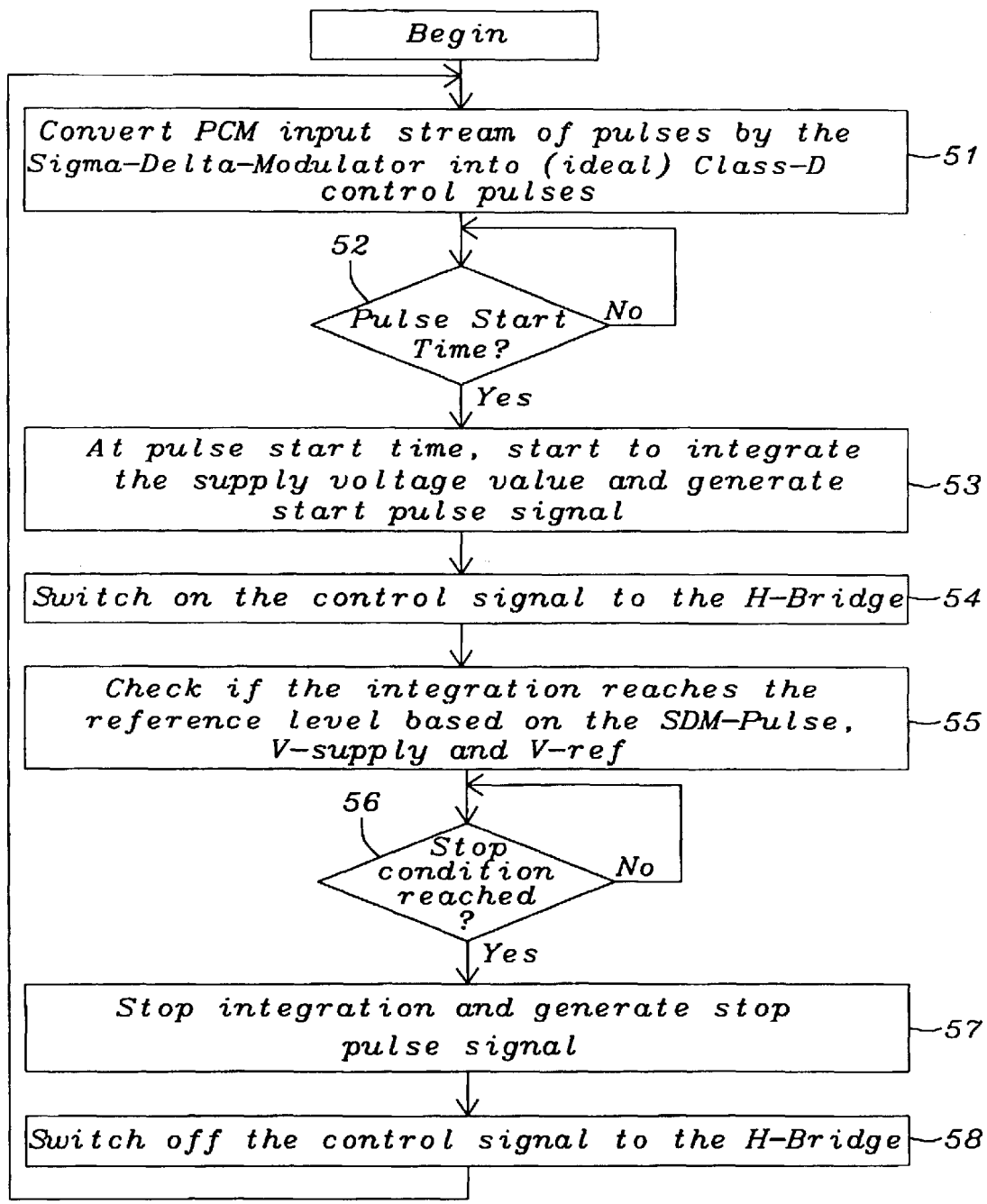
FIG. 5 shows a method for linearization of output pulses in a Class-D Amplifier.

The method to achieve the objectives of this invention is illustrated in FIG. 5.

First, in step 51, the input signal is converted by the Sigma-Delta-Modulator into ideal (yet uncompensated) PDM control pulses. Now, after pulse start time 52, said "Length of Pulse Integrator" starts to integrate the supply voltage value and generates start pulse signal 53. The Pulse Generator switches on the control signal to the H-Bridge in step 54 and the circuit checks for said integration to reach the reference level 55. As soon as said integration reaches the reference level 56, it stops integration based on the SDM-Pulse, V-supply and V-ref in step and generates stop pulse signal in step 57. Now, in step 58 said Pulse Generator switches off the control signal to said H-Bridge.

While the invention has been particularly shown and described with reference to the preferred embodiments thereof, it will be understood by those skilled in the art that various changes in form and details may be made without departing from the spirit and scope of the invention.

What is claimed is:

1. A circuit to linearize the output pulses in a Class-D Amplifier, comprising:

means to convert the input signal into PDM (Pulse Density Modulated) control pulses;

means to define a value representing the actual voltage across the output load;

means to integrate said value representing said actual voltage across the output load;

means to define the output pulse area reference;

means to further determine the optimized width of the power driver control pulses, based on said integrated value representing the actual voltage across said output load and said output pulse area reference;

means to further generate the time-voltage-area corrected power driver control pulses;

means for a Class-D power driver to drive voltage into an output load, controlled by said power driver control pulses; and means for an output load as the amplifier output's target.

2. The circuit of claim 1 wherein said input signal is an analog signal.

3. The circuit of claim 1 wherein said input signal is a digital signal with low sampling rate and high resolution.

4. The circuit of claim 1 wherein said means to convert said input signal into PDM (Pulse Density Modulated) control pulses is a Sigma Delta Modulator.

5. The circuit of claim 1 wherein said means for a Class-D power driver is an H-bridge.

6. The circuit of claim 1 wherein said means to define said output pulse area reference assume a fixed and a prior known magnitude.

7. The circuit of claim 1 wherein said means to define said output pulse area reference are defined by an external reference control function.

8. The circuit of claim 1 wherein said means to define a value representing the actual voltage across the output load, takes the voltage directly from the points connected to said output load.

9. The circuit of claim 1 wherein said means to define a value representing the actual voltage across the output load, takes said H-Drive's supply voltage as a very close compromise.

10. The circuit of claim 1 wherein said means to further determine said optimized width of the power driver control pulses comprises an integrator for said value, representing the actual voltage across the output load.

11. The circuit of claim 1 wherein said means to integrate said value representing the actual voltage across the output load is implemented as an integrated analog circuit.

12. The circuit of claim 1 wherein said means to integrate said value representing the actual voltage across the output load is implemented as an integrated digital logic function.

13. The circuit of claim 1 wherein said means to integrate said value representing the actual voltage across the output load is implemented as a calculating algorithm in a digital signal processor.

14. The circuit of claim 1 wherein said means to further determine said optimized width of the power driver control pulses is implemented as an integrated digital logic function.

15. The circuit of claim 1 wherein said means to further determine said optimized width of the power driver control pulses is implemented as a calculating algorithm in a digital signal processor.

16. The circuit of claim 1 wherein said means to further generate the time-voltage-area corrected power driver control pulses is implemented as an integrated analog circuit.

17. The circuit of claim 1 wherein said means to further generate the time-voltage-area corrected power driver control pulses is implemented as an integrated digital logic function.

18. The circuit of claim 1 wherein said means to further generate the time-voltage-area corrected power driver control pulses is implemented as a calculating algorithm in a digital signal processor.

19. A method to linearize the output pulses in a Class-D Amplifier, comprising:

providing means to convert the input signal into PDM (Pulse Density Modulated) control pulses, means to define a value representing the actual voltage across the output load, means to integrate a value representing said actual voltage across the output load, means to define said output pulse area reference, means to determine said optimized width of the power driver control pulses, means to further generate said time-voltage-area corrected power driver control pulses, means for a Class-D power driver to drive voltage into an output load, controlled by said control pulses and means for an output load as the amplifier output target, converting said input signal into PDM control pulses;

defining said value representing the actual voltage across the output load integrating said value representing the actual voltage across the output load;

defining the output pulse area reference;

determine said optimized width of the power driver control pulses;

generating said time-voltage-area corrected power driver control pulses;

applying said power driver control pulses to said Class-D power driver; and driving said power driver's output voltage to the output load (typically a loudspeaker).

20. The method of claim 19 wherein said input signal to convert is an analog signal.

21. The method of claim 19 wherein said input signal to convert is a digital signal with low sampling rate and high resolution.

22. The method of claim 19 wherein converting input signal into ideal PDM power driver control pulses is done by a Sigma Delta Modulator.

23. The method of claim 19 wherein an H-Bridge is used for driving voltage to the output load.

24. The method of claim 19 wherein said output pulse area reference is assumed to be of fixed and a priori known magnitude.

25. The method of claim 19 wherein defining said output pulse area reference is performed by an external reference control function.

26. The method of claim 19 wherein defining a value representing the actual voltage across the output load, takes the voltage directly from the points connected to said output load.

27. The method of claim 19 wherein to defining a value representing the actual voltage across the output load, takes said H-Drive's supply voltage as a very close compromise.

28. The method of claim 19 wherein said method to determine said optimized width of the power driver control pulses compares said integrated value, representing the actual voltage across the output load, and the value of said output pulse area reference to set the end-point of said time-voltage-area corrected power driver control pulses.

29. The method of claim 19 wherein integrating said value representing the actual voltage across the output load is implemented by an integrated analog circuit.

30. The method of claim 19 wherein integrating said value representing the actual voltage across the output load is implemented by an integrated digital logic function.

31. The method of claim 19 wherein integrated said value representing the actual voltage across the output load is implemented by a calculating algorithm in a digital signal processor.

32. The method of claim 19 wherein further determining said optimized width of the power driver control pulses is performed in an integrated analog circuit.

33. The method of claim 19 wherein further determining said optimized width of the power driver control pulses is performed in an integrated digital logic function.

34. The method of claim 19 wherein further determining said optimized width of the power driver control pulses is performed in a calculating algorithm in a digital signal processor.

35. The method of claim 19 wherein further generating said time-voltage-area corrected power driver control pulses is performed in an integrated analog circuit.

36. The method of claim 19 wherein generating said power driver control pulses is performed in an integrated digital logic function.

37. The method of claim 19 wherein generating said time-voltage-area corrected power driver control pulses is performed in a calculating algorithm in a digital signal processor.

* * * * *